(12) United States Patent
Hashimoto et al.

(10) Patent No.: US 12,214,692 B2
(45) Date of Patent: Feb. 4, 2025

(54) ABNORMALITY DETERMINATION APPARATUS AND ABNORMALITY DETERMINATION METHOD

(71) Applicant: TOYOTA JIDOSHA KABUSHIKI KAISHA, Aichi-ken (JP)

(72) Inventors: Toshiya Hashimoto, Miyoshi (JP); Daiki Yokoyama, Gotemba (JP)

(73) Assignee: TOYOTA JIDOSHA KABUSHIKI KAISHA, Aichi-Ken (JP)

(*) Notice: Subject to any disclaimer, the term of this patent is extended or adjusted under 35 U.S.C. 154(b) by 381 days.

(21) Appl. No.: 17/569,508

(22) Filed: Jan. 6, 2022

(65) Prior Publication Data

US 2022/0252678 A1 Aug. 11, 2022

(30) Foreign Application Priority Data

Feb. 8, 2021 (JP) .................... 2021-018219

(51) Int. Cl.
*B60L 53/68* (2019.01)
*B60L 53/124* (2019.01)
(Continued)

(52) U.S. Cl.
CPC ............. *B60L 53/68* (2019.02); *B60L 53/124* (2019.02); *B60L 53/66* (2019.02); *G01C 21/3415* (2013.01); *G01R 31/42* (2013.01); *G07C 5/008* (2013.01); *G07C 5/085* (2013.01); *H02J 50/12* (2016.02); *H02J 50/60* (2016.02)

(58) Field of Classification Search
CPC ........ B60L 53/68; B60L 53/124; B60L 53/66; G01C 21/3415; G01R 31/42; G07C 5/008; G07C 5/085; H02J 50/12; H02J 50/60
See application file for complete search history.

(56) References Cited

U.S. PATENT DOCUMENTS

2013/0119925 A1   5/2013   Kawamura
2013/0307471 A1   11/2013  Ichikawa et al.
(Continued)

FOREIGN PATENT DOCUMENTS

JP   2010-167898 A   8/2010
JP   2019158379 A    9/2019
(Continued)

*Primary Examiner* — John C Kuan
(74) *Attorney, Agent, or Firm* — HAUPTMAN HAM, LLP

(57) ABSTRACT

An abnormality determination apparatus includes a processing unit, a communication unit configured to communicate with a plurality of mobile bodies and a storage unit configured to store power reception history information received from each of the mobile body. The power reception history information includes a power receiving location of the received power received by the power receiving device, and a power transmission efficiency calculated based on the received power, or the received power. The processing unit is configured to extract information of the power receiving location where the power transmission efficiency is less than a predetermined value from the power reception history information of the plurality of the mobile bodies stored in the storage unit, and is configured to determine an abnormality of the power transmission device based on the information of the extracted power receiving location.

15 Claims, 10 Drawing Sheets

(51) Int. Cl.
*B60L 53/66* (2019.01)
*G01C 21/34* (2006.01)
*G01R 31/42* (2006.01)
*G07C 5/00* (2006.01)
*G07C 5/08* (2006.01)
*H02J 50/12* (2016.01)
*H02J 50/60* (2016.01)

(56) References Cited

U.S. PATENT DOCUMENTS

| | | |
|---|---|---|
| 2016/0355095 A1 | 12/2016 | Okamoto |
| 2017/0217319 A1* | 8/2017 | Araki .................... B60L 53/122 |
| 2018/0026483 A1* | 1/2018 | Mo ......................... B60L 53/66 |
| | | 701/22 |
| 2019/0052126 A1* | 2/2019 | Lee ......................... H02J 50/60 |
| 2019/0275904 A1* | 9/2019 | Matsuo ................... B60L 50/50 |
| 2022/0281343 A1* | 9/2022 | Yang ..................... B60L 53/305 |
| 2022/0363147 A1 | 11/2022 | Hashimoto et al. |
| 2022/0363148 A1 | 11/2022 | Hashimoto et al. |

FOREIGN PATENT DOCUMENTS

| | | | |
|---|---|---|---|
| WO | WO-2017025020 A1 * | 2/2017 | |
| WO | WO-2021068947 A1 * | 4/2021 | ............. G01D 21/02 |

* cited by examiner

ABNORMALITY DETERMINATION APPARATUS AND ABNORMALITY DETERMINATION METHOD

RELATED APPLICATIONS

The present application claims priority of Japanese Patent Application No. 2021-018219 filed Feb. 8, 2021, the disclosure of which is hereby incorporated by reference herein in its entirety.

FIELD

The present disclosure relates to an abnormality determination apparatus and an abnormality determination method.

BACKGROUND OF THE DISCLOSURE

JP-A-2019-158379 discloses a conventional dynamic wireless power transfer system in which a difference in battery charge before and after a vehicle passes through an electrified road (a road on which a power transmission device is installed) is calculated, and if a difference in battery charge is equal to or greater than a predetermined value, the passed electrified road is determined to be an electrified road that may cause deterioration of the battery.

SUMMARY

In a dynamic wireless power transfer system, an abnormality in the power transmission device will affect all the power receiving device-mounted vehicles passing through the electrified road on which the power transmission device is installed. Therefore, it is required to be able to detect abnormalities in power transmission equipment. However, the dynamic wireless power transfer system has a problem in that, when an abnormality occurs in the power transmission from the power transmission device to the power receiving device, it is necessary to determine whether the cause of the abnormality is the power transmission device or the power receiving device.

The present disclosure was made focusing on such a problem and has as its object of the present disclosure to detect an abnormality of a power transmission device and its installation location.

In order to solve the above problems, according to an aspect of the present disclosure, an abnormality determination apparatus for determining abnormality of a power transmission device installed on a road is provided. An abnormality determination apparatus according to an aspect of the present disclosure includes a processing unit, a communication unit configured to communicate with a plurality of mobile bodies each comprising a power receiving device for receiving power wirelessly transmitted from the power transmission device, and a storage unit configured to store power reception history information received from each of the plurality of mobile bodies. The power receiving history information includes a power receiving location of the received power received by the power receiving device, and either a power transmission efficiency calculated based on the received power, or the received power. The processing unit is configured to extract information of the power receiving location where the power transmission efficiency is less than a predetermined value from the power reception history information of the plurality of the mobile bodies stored in the storage unit, and is configured to determine an abnormality of the power transmission device based on the information of the extracted power receiving location.

According to another embodiment of the present disclosure, there is provided an abnormality determination method for determining an abnormality of a power transmission device installed on a road. An abnormality determination method according to an aspect of the present disclosure comprises the steps of: collecting power reception history information including a power receiving location of received power received by the power receiving device, and either a power transmission efficiency calculated based on the received power, or the received power, by communicating with a plurality of mobile bodies each including a power receiving device for receiving power wirelessly transmitted from the power transmission device; extracting information of the power receiving location where the power transmission efficiency is less than a predetermined value from the collected power reception history information; and determining an abnormality of the power transmission device based on the extracted information of the power receiving location.

According to these aspects of the present disclosure, it is possible to detect an abnormality of the power transmission device and its installation location.

DESCRIPTION OF EMBODIMENTS

Figure 1:
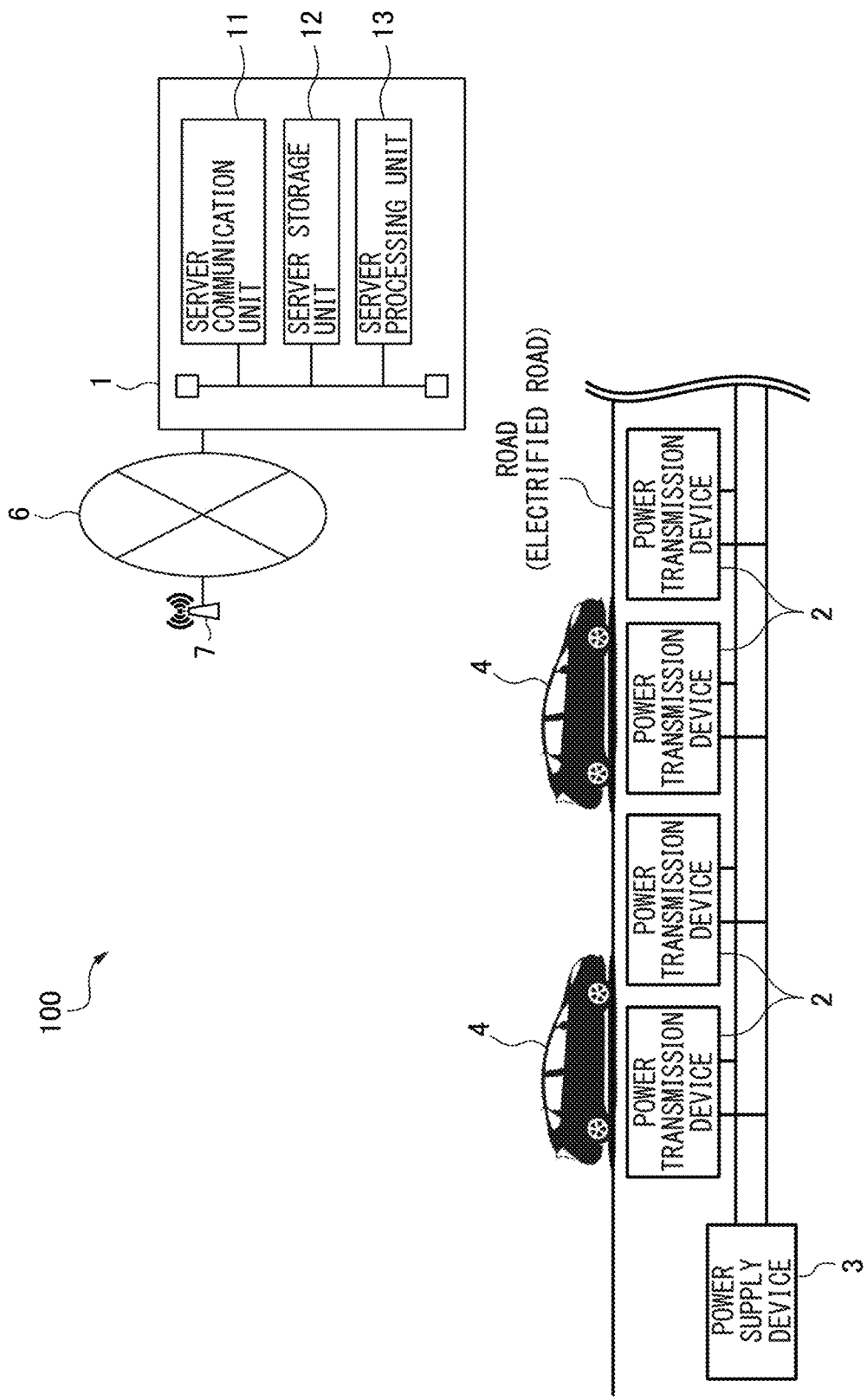
FIG. 1 is a schematic view of the configuration of a dynamic wireless power transfer system.

Hereinafter, embodiments of the present disclosure will be described in detail with reference to the drawings. In the following description, like components are denoted by the same reference numerals.

First Embodiment

FIG. 1 is a schematic view of the configuration of a dynamic wireless power transfer system 100 according to a first embodiment of the present disclosure.

The running wireless power supply system 100 according to the present embodiment includes a server 1, a plurality of power transmission devices 2 which are continuously installed at predetermined intervals along the road, a power supply device 3 for supplying power to each power transmission device 2, and a plurality of vehicles 4 each having a power receiving device 5 (refer to FIG. 2) mounted thereon for receiving power wirelessly transmitted from the power transmission device 2. In the following description, the road where the power transmission device 2 is installed is referred to as an "electrified road" if necessary.

The server 1 includes a server communication unit 11, a server storage unit 12, and a server processing unit 13.

The server communication unit 11 has a communication interface circuit for connecting the server 1 to the network 6 via, for example, a gateway or the like, and is configured to communicate with the vehicle 4.

The server storage unit 12 has a storage medium such as a hard disk drive (Hard Disk Drive), an optical recording medium, and a solid-state memory, and stores various computer programs, data, and the like used for processing in the server processing unit 13.

The server processing unit 13 includes one or a plurality of processors and peripheral circuits thereof. The server processing unit 13 executes various computer programs stored in the server storage unit 12 and comprehensively controls the overall operation of the server 1, and is, for example, a CPU (Central Processing Unit). The processing performed by the server processing unit 13, and thus the server 1, will be described later with reference to FIGS. 3 to 6.

Figure 2:
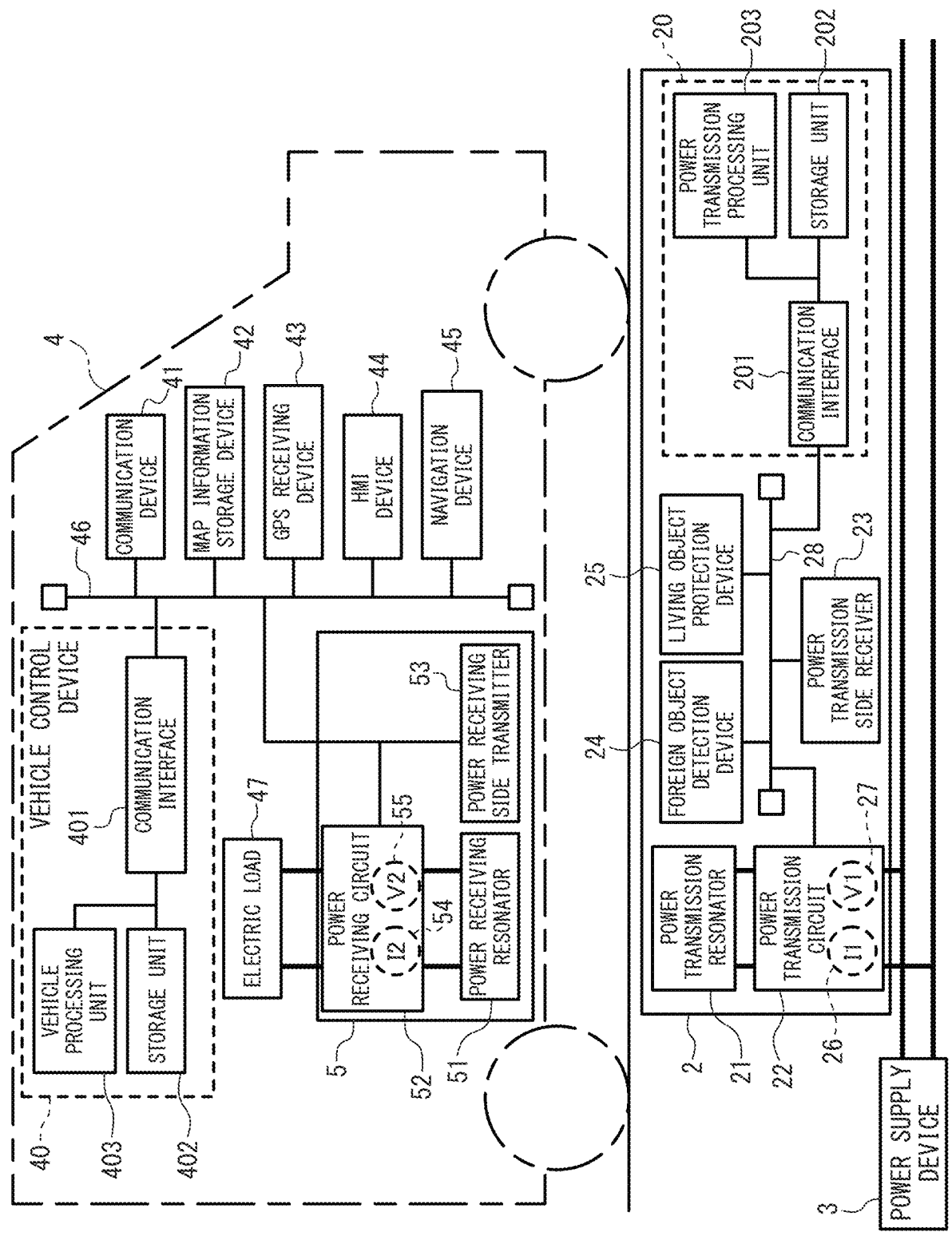
FIG. 2 is a view showing a detailed configuration of a power transmission device and a vehicle according to the first embodiment of the present disclosure.

FIG. 2 is a diagram illustrating a detailed configuration of the power transmission device 2 and the vehicle 4 according to the present embodiment.

The power transmission device 2 includes a power transmission resonator 21, a power transmission circuit 22, a power transmission side receiver 23, a foreign object detection device 24, a living object protection device 25, and a power transmission control device 20. Transmission circuit 22, the power transmission side receiver 23, the foreign object detection device 24, and the living object protection device 25 are connected to the power transmission control device 20 via the inner network 28 in the power transmission device 2 conforming to the standard such as CAN (Controller Area Network).

The power transmission resonator 21 is a resonance circuit including power transmission coils and is configured to resonate at a predetermined resonance frequency $f_0$. The vehicle 4 is equipped with the power receiving resonator 51 that corresponds to the power transmission resonator 21. The power receiving resonator 51 is a resonance circuit including power receiving coils and is configured to resonate at the same resonance frequency $f_0$ as the power transmitting resonator 21. By resonating the power transmission resonator 21, the power receiving coils of the power receiving resonator 51 and the power transmission coils of the power transmission resonator 21, which are located spatially apart, are magnetically coupled, and power transmission from the power transmission device 2 to the power receiving device 5 (wireless power supply) is performed.

The power transmission circuit 22 is an electric circuit comprising an inverter which, based on a control signal from the power transmission control device 20, is configured to convert the DC power supplied from the power supply device 3 into a desired AC power to be supplied to the power transmission resonator 21. The power transmission circuit 22 is provided with a power transmission side current sensor 26 for detecting a current I1 flowing through the power transmission resonator 21 (hereinafter referred to as "power transmission current") and a power transmission side voltage sensor 27 for detecting a voltage V1 applied to the power transmission resonator 21 (hereinafter referred to as "power transmission voltage"). Transmission side current I1 and the power transmission voltage V1 detected by each sensor 26 and 27 are input to the power transmission control device 20, respectively.

The power transmission side receiver 23 performs wireless communication between the power receiving-side transmitter 53 mounted on each vehicle 4 using a predetermined wireless communication line, and receives an approach signal transmitted from the power receiving-side transmitter 53. The approach signal is a signal for informing that the vehicle 4 is approaching the power transmission device 2, and a signal for prompting the preparation of power transmission to the power transmission device 2 which has received the approach signal.

The foreign object detection device 24 detects the metal foreign object present on the road between the power transmission device 2 and the power receiving device 5. This is because when the power transmission from the power transmission device 2 to the power receiving device 5 is performed in a state where the metal foreign object is present in the space between the power transmission device 2 and the power receiving device 5, there is a possibility that the metal foreign object may be heated and the power transmission efficiency may be reduced. Foreign object detection device 24, in response to a request from the power transmission control device 20, transmits the foreign object detection information whether the metal foreign object is present to the power transmission control device 20. The detection method of the metal foreign object by the foreign object detection device 24 is not particularly limited, and various well known methods such as detection by a metal detector can be used.

The living object protection device 25 detects a living object, such as a human or an animal, existing in the vicinity of the power transmission device 2. This is because when the power transmission device 2 is driven in a state where a living object is present around the power transmission device 2, the living object is exposed to the leakage magnetic field from the power transmission device 2, which may affect health. In response to a request from the power transmission control device 20, the living object protection device 25 transmits living object detection information as to whether or not a living object is present to the power transmission control device 20. A method of detecting a living object by the living object protection device 25 is not particularly limited, and various well known methods such as image recognition can be used, for example.

The power transmission control device 20 includes a communication interface 201, a storage unit 202, and a power transmission processing unit 203.

The communication interface 201 is a communication interface circuit for connecting the power transmission control device 20 to the internal network 28 in the power transmission device 2.

The storage unit 202 includes a storage medium such as an HDD, an optical recording medium, or a semiconductor memory, and stores various computer programs and data used for processing in the power transmission processing unit 203.

The power transmission processing unit 203 includes one or more processors and peripheral circuits thereof. The power transmission processing unit 203 executes various computer programs stored in the storage unit 202 to collectively control the power transmission device 2, and is, for example, a CPU.

The power transmission processing unit 203, and thus the power transmission control device 20, for example, when receiving the approach signal via the power transmission side receiver 23, drives the foreign object detection device 24 and the living object protection device 25 to acquire the foreign object detection information and the living object detection information. When the presence of at least one of a metal foreign object and a living object is confirmed, the power transmission control device 20 controls the power transmission circuit 22 so that the power transmission from the power transmission device 2 to the power receiving device 5 is not performed. On the other hand, when the presence of the metal foreign object and the living object is not confirmed, the power transmission control device 20 controls the power transmission circuit 22 so that the power transmission P1 [W] becomes a predetermined target power transmission $P1_{t\,g\,t}$.

In the present embodiment, the target power transmission $P1_{t\,g\,t}$ is set to a fixed value in advance, but the target power transmission $P1_{t\,g\,t}$ may be set to the requested received power if, for example, the approaching signal includes information on the requested received power of the source vehicle 4 of the approaching signal.

Note the power transmission current I1 is correlated with the coupling coefficient k indicating the magnetic coupling degree between the power receiving coil of the power receiving resonator 51 and the power transmission coil of the power transmission resonator 21. Specifically, transmission side current I1 tends to increase as the engagement coefficient k is small. Therefore, after receiving the approach signal, for example, by monitoring the power transmission current I1, it is possible to determine the approach and departure of the vehicle 4 with respect to the power transmission device 2. The control of the power transmission circuit 22 can be started or terminated in response to the determination.

The vehicle 4 includes a communication device 41, a map information storage device 42, a GPS receiving device 43, an HMI device 44, a navigation device 45, a power receiving device 5, and a vehicle control device 40. The communication device 41, the map information storage device 42, the GPS receiving device 43, the HMI device 44, the navigation device 45, and the power receiving device 5 are connected to the vehicle control device 40 via an in-vehicle network 46 conforming to a standard such as CAN.

The communication device 41 is an in-vehicle terminal having a wireless communication function. The communication apparatus 41 accesses a wireless base station 7 (refer to FIG. 1) connected to the network 6 (see FIG. 1) via a gateway (not shown) or the like, and is thereby connected to the network 6 via the radio base station 7. As a result, the vehicle 4 and the server 1 communicate with each other.

The map information storage device 42 stores map information including location information of roads, information on road types, for example, information on whether a road is an electrified road, and the like.

The GPS receiving device 43 receives radio waves from an artificial satellite to identify the latitude and longitude of the host vehicle 4, and detects the current position of the host vehicle 4. GPS receiving device 43 transmits the detected current position information of the host vehicle 4 to the vehicle control device 40.

The HMI device 44 is an interface for exchanging information with a vehicle occupant. The HMI device 44 according to the present embodiment includes a display and a speaker for providing various types of information to the vehicle occupant, and a touch panel (or operation button) for the vehicle occupant to perform an input operation of information. The HMI device 44 transmits the input information input by the vehicle occupant to various devices requiring the input information (e.g., a navigation device if the input information is a destination), and provides the information received via the in-vehicle network 46 to the vehicle occupant by displaying the information on a display or the like.

The navigation device 45 is a device for guiding the vehicle 4 to a destination set by the vehicle occupant via the HMI device 44. For example, the navigation device 45 sets the running route to the destination based on the current position information and the map information of the host vehicle 4, and transmits the information relating to the set running route as the navigation information to the vehicle control device 40 or the HMI device 44 or the like.

Power receiving device 5 includes a power receiving resonator 51, a power receiving circuit 52, a power receiving side transmitter 53.

As described above, the power receiving resonator 51 is a resonance circuit including power receiving coils, and is configured to resonate at the same resonance frequency $f_0$ as the power transmitting resonator 21.

Power receiving circuit 52 is an electric circuit comprising a rectifier and a DC/DC converter, the AC power output from the power receiving resonator 51 is converted by the rectifier into DC power, which is configured to be supplied to the electric load 47 via DC/DC converter. The electric load 47 includes, for example, a battery, an electric motor, and the like, but is not particularly limited thereto. In the present embodiment, the power receiving circuit 52 is connected to a battery as an electric load 47. The power receiving circuit 52 is provided with a power receiving current sensor 54 for detecting the output current (hereinafter referred to as "power receiving current") I2 of the rectifier and a power receiving voltage sensor 55 for detecting the output voltage (hereinafter referred to as "power receiving voltage") V2 of the rectifier, and the power receiving current I2 and the power receiving voltage V2 detected by the respective sensors 54 and 55 are input to the vehicle control device 40, respectively.

Power receiving side transmitter 53 performs wireless communication between the power transmission side receiver 23 of each power transmission device 2 using a predetermined wireless communication line, and transmits the proximity signal described above to each power transmission device 2.

The vehicle control device 40 includes a communication interface 401, a storage unit 402, and a vehicle processing unit 403.

The communication interface 401 is a communication interface circuit for connecting the vehicle control device 40 to the in-vehicle network 46.

Storage unit 402 has a storage medium such as an HDD or an optical recording medium, a semiconductor memory, and stores various computer programs and data used for processing in the vehicle processing unit 403.

The vehicle processing unit 403 includes one or more processors and peripheral circuits thereof. The vehicle processing unit 403 executes various computer programs stored in the storage unit 402 to collectively control the vehicle 4, and is, for example, a CPU.

The vehicle processing unit 403, thus the vehicle control device 40, for example, when detecting that the vehicle 4 is approaching the electrified road, starts transmitting the approach signal via the power receiving-side transmitter 53, and controls the power receiving circuit 52 (DC/DC converters) to control the received voltage V2 to the target received voltage $V2_{tgt}$. This is because the power transmission efficiency η between the resonators correlates with the power reception voltage V2, and in the present embodiment, the target power reception voltage $V2_{tgt}$ is set to a predetermined voltage value at which a desired power transmission efficiency $\eta_{tgt}$ can be obtained.

Incidentally, the method of detecting that approaching the electrified road is not particularly limited, for example, may be detected based on the current position information and the navigation information (running route) of the vehicle 4. Also, if an infrastructure facility installed in front of the electrified road is transmitting a signal to the passing vehicle 4 indicating that it is going to pass through the electrified road, it may be detected that it has approached the electrified road by receiving the signal.

Here, in the case where an abnormality occurs in the power transmission from the power transmission device 2 to the power receiving device 5, when the cause of the abnormality was in the power transmission device 2, it will affect all vehicles 4 passing on the electrified road. That is, when an abnormality occurs in the power transmission device 2, the effect will extend over a wide range. Therefore, it is required to be able to detect the abnormality of the power transmission device 2.

However, when an abnormality occurs in the power transmission from the power transmission device 2 to the power receiving device 5, since the power transmission device 2 and the power receiving device 5 are physically separated from each other, the dynamic wireless power transfer system 100 needs to determine whether the cause of the abnormality is the power transmission device 2 or the power receiving device 5. Further, since the power receiving apparatus 5 is mounted on the vehicle 4 which moves at a high speed, it is difficult to determine in which power transmission device 2 the abnormality has occurred.

Therefore, in the present embodiment, the power reception history information of each vehicle 4 is aggregated to the server 1, and it is detected the abnormality of the power transmission device 2 and the installation position of the power transmission device 2 where the abnormality has occurred, based on the power reception history information of each vehicle 4 aggregated to the server 1. In the present embodiment, the power reception history information of the vehicle 4 is information associated with the actual power transmission efficiency $\eta_{real}$ calculated on the basis of the received power P2 [W] received by the power receiving apparatus 5 during the running on the electrified road and the position information (i.e. the power receiving location of the received power P2) of the location where the power transmission efficiency $\eta_{real}$ is obtained.

Hereinafter abnormal detection control of the power transmission device 2 according to the present embodiment will be described.

Figure 3:
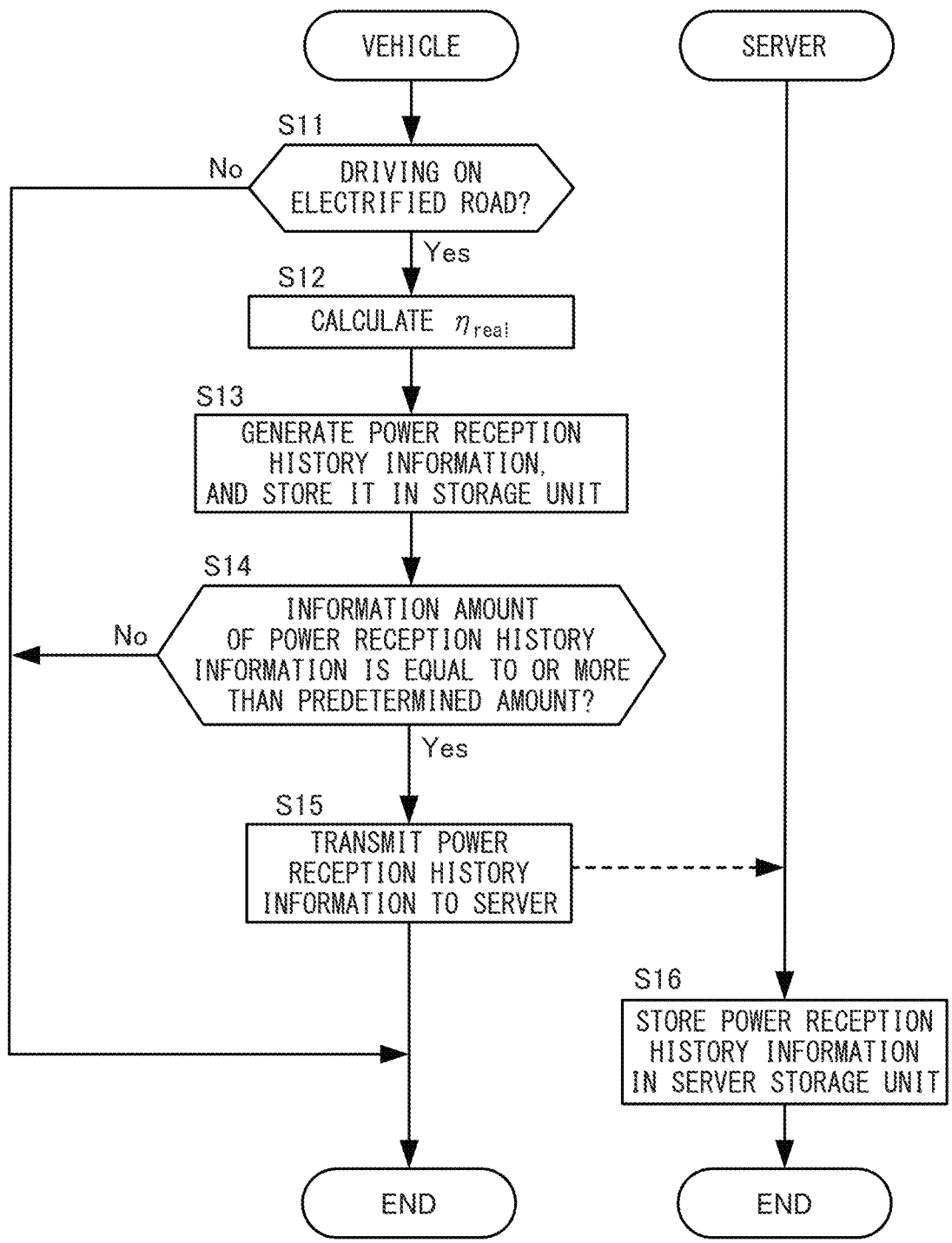
FIG. 3 is a flowchart for explaining details of processing executed between each vehicle and the server in order to aggregate the power reception history information of each vehicle in the server.

FIG. 3 is a flowchart for explaining details of processing executed between each vehicle 4 and the server 1 in order to aggregate the power reception history information of each vehicle 4 in the server 1.

In step S11, the vehicle control device 40 of each vehicle 4, based on the current position information and the map information of the host vehicle 4, determines whether or not the host vehicle 4 is traveling on the electrified road. If the vehicle 4 is traveling on an electrified road, the vehicle control device 40 of each vehicle 4 proceeds to the process of step S12. On the other hand, the vehicle control device 40 of each vehicle 4, if the host vehicle 4 is not traveling on the electrified road, ends the present process.

In step S12, the vehicle control device 40 of the respective vehicles 4, based on the received current I2 and the received voltage V2, calculates the received power P2 received by the power receiving device 5. The vehicle control device 40 calculates the power transmission efficiency $\eta_{real}$ (=P2/P1$_{tgt}$) by dividing the received power P2 by the target transmission power P1$_{tgt}$.

If the value of the target power transmission power P1$_{tgt}$ is a fixed value as in the present embodiment, the value can be acquired by storing the fixed value in the storage unit 402 of the vehicle control device 40 of the vehicle 4. Further, for example, the vehicle control device 40 of the respective vehicles 4 may calculate the request received power based on the state of the electric load 47 (e.g., the battery charge rate if the electric load 47 is a battery), and include the information relating to the required received power in the approach signal. In this case, the required received power can be set as the target transmission power P1$_{tgt}$.

In step S13, the vehicle control device 40 of each vehicle 4 generates the power reception history information, associated with a power transmission efficiency $\eta_{real}$ and the position information of the location where the power transmission efficiency $\eta_{real}$ is obtained, and stores it in the storage unit 402. In other words, the position information of the location where the power transmission efficiency $\eta_{real}$ is obtained is a power receiving location of the power receiving power P2 and is the current position information of the vehicle 4 when the power receiving current I2 and the power receiving voltage V2 used for the calculation of the power transmission efficiency $\eta_{real}$ are obtained.

In step S14, the vehicle control device 40 of each vehicle 4 determines whether or not the information amount of the power reception history information stored in the storage unit 402 is equal to or more than a predetermined amount. If the information amount of the power reception history information is equal to or larger than the predetermined amount, the vehicle control device 40 of each vehicle 4 proceeds to the process of step S15. On the other hand, the vehicle control device 40 of each vehicle 4, if the information amount of the power reception history information is less than a predetermined amount, ends the present process.

In step S15, the vehicle control device 40 of each vehicle 4 transmits all the power reception history information stored in the storage unit 402 to the server 1, and deletes the transmitted power reception history information from the storage unit 402.

In step S16, the server 1 stores the power reception history information received from each vehicle 4 in the server storage unit 12. In this manner, the power reception history information of each vehicle 4 is aggregated in the server 1.

Figure 4:
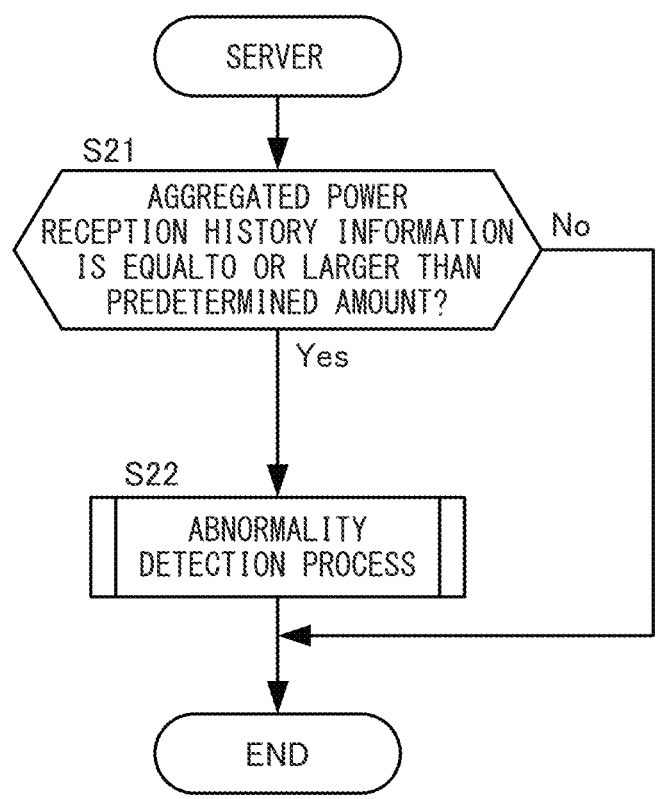
FIG. 4 is a flowchart for explaining details of processing executed in the server for detecting an abnormality in the power transmission device.

FIG. 4 is a flowchart for explaining details of processing executed in the server 1 to detect an abnormality in the power transmission device 2.

In step S21, the server 1 determines whether or not the information amount of the power reception history information stored in the server storage unit 12, that is, the information amount of the aggregated power reception history information in which the power reception history information of each vehicle 4 is aggregated, is equal to or larger than a predetermined amount. If the amount of information in the aggregated power receiving history information is equal to or larger than a predetermined amount, the server 1 proceeds to the process in step S22. On the other hand, if the information amount of the aggregated power reception history information is less than the predetermined amount, the server 1 determines that the information amount for detecting the abnormality of the power transmission device 2 is not sufficient, and ends the present process.

In step S22, the server 1 performs an abnormality detection process for detecting an abnormality of the power transmission device 2 and an installation position of the power transmission device 2 where the abnormality has occurred, based on the aggregated power reception history information. Details of the error detection process will be described with reference to FIG. 5.

Figure 5:
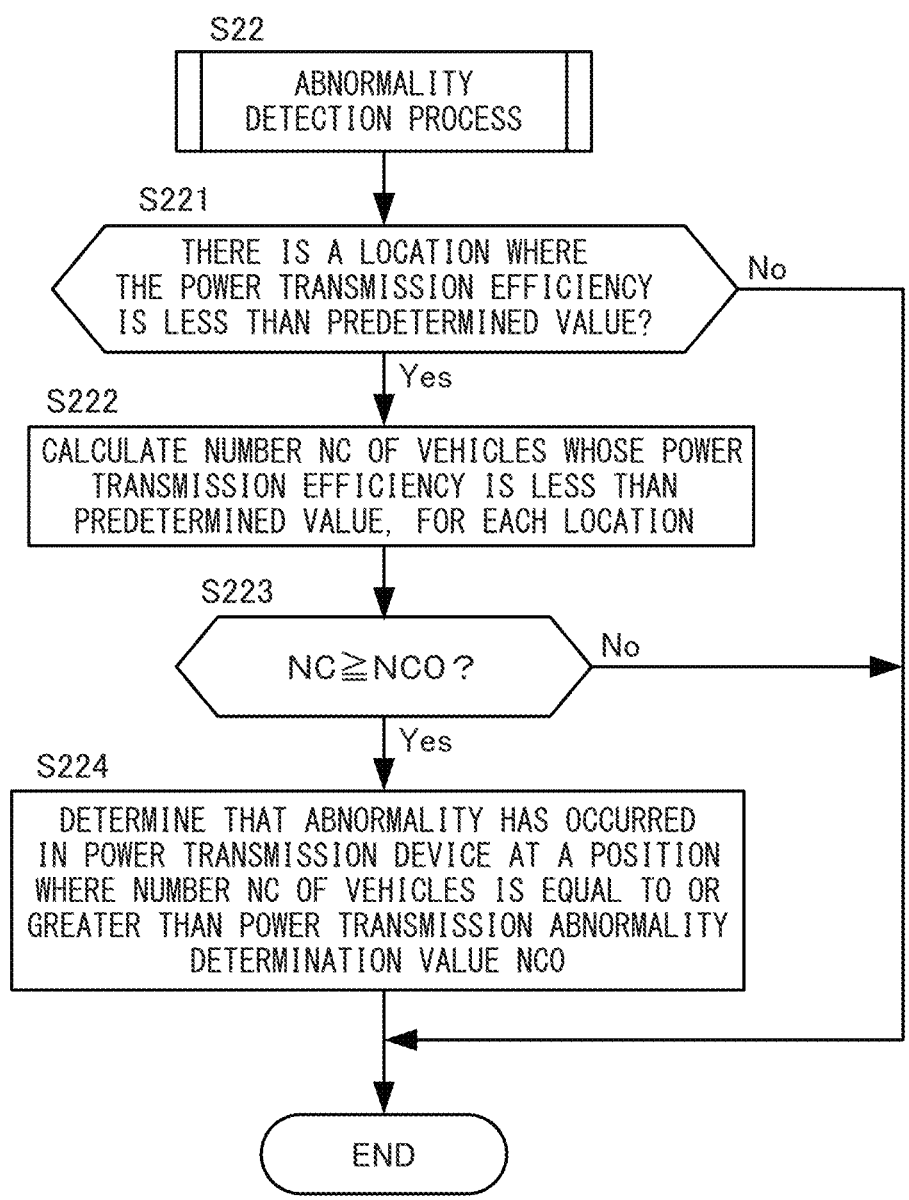
FIG. 5 is a flowchart for explaining details of the abnormality detection process according to the first embodiment of the present disclosure.

FIG. 5 is a flowchart for explaining details of the abnormality detection process.

In step S221, the server 1 refers to the aggregated power reception history information of the vehicles 4, and determines whether or not there is a location (i.e., a location where an abnormality may have occurred in the power transmission) where the power transmission efficiency $\eta_{real}$ is less than a predetermined value $\eta1$. The predetermined value $\eta1$ is a value less than the desired power transmission efficiency $\eta_{real}$ as described above. If there is a site where the power transfer efficiency $\eta_{real}$ is less than the predetermined value $\eta1$, the server 1 proceeds to the process of step S222. On the other hand, if there is no location where the power transfer efficiency $\eta_{real}$ is less than the predetermined value $\eta1$, the server 1 determines that there is no abnormality, and ends the present process.

In step S222, the server 1 refers to the aggregate power reception history information, and calculates the number NC of vehicles 4 whose power transmission efficiency $\eta_{real}$ is less than the predetermined value $\eta1$ for each location where the power transmission efficiency $\eta_{real}$ is less than the predetermined value $\eta1$. That is, for each location where the presence is confirmed in step S221, the number of vehicles 4 whose power transmission efficiencies $\eta_{real}$ are less than the predetermined value $\eta1$ at that location is calculated.

In step S223, the server 1 determines whether or not there is a place where the number NC of vehicles 4 is equal to or larger than a predetermined abnormal power transmission determination value NC0. If there is a place where the number NC of vehicles 4 is equal to or more than the transmission abnormality determination value NC0, the server 1 determines that there is a high probability that an abnormality has occurred in the power transmission device 2 installed at the place because the power transmission efficiencies $\eta_{real}$ of the plurality of vehicles 4 equal to or more than the transmission abnormality determination value NC0 are less than the predetermined value $\eta1$ at the place, and proceeds to the process of step S224. On the other hand, if there is no place where the number NC of vehicles 4 is equal to or larger than the transmission abnormality determination value NC0, the server 1 ends the present process without executing the abnormality determination.

In the step S224, the server 1 determines that an abnormality has occurred in the power transmission device 2 at a position where the number NC of the vehicles 4 is equal to or greater than the power transmission abnormality determination value NC0.

As described above, in the present embodiment, when there is a place where the number NC of vehicles 4 whose power transmission efficiency $\eta_{real}$ is less than the predetermined value $\eta1$ is equal to or greater than the transmission abnormality determination value NC0, it is determined that an abnormality has occurred in the power transmission device 2 set in the place. However, the method of determining the abnormality of the power transmission device 2 is not limited to such a method.

For example, it is also possible to determine whether or not an abnormality has occurred in the power transmission device 2 set at a place where the power transmission efficiency $\eta_{real}$ is less than the predetermined value $\eta1$, based on the ratio of the vehicles 4 whose power transmission efficiency $\eta_{real}$ is less than the predetermined value $\eta1$ (hereinafter referred to as "abnormality occurrence ratio"). The abnormality occurrence ratio can be, for example, the ratio R of the number NC of vehicles 4 in which the power transmission efficiency $\eta_{real}$ is less than the predetermined value $\eta1$ at a location where the power transmission efficiency $\eta_{real}$ is less than the predetermined value $\eta1$, and the number MC of vehicles 4 in which the power transmission efficiency $\eta_{real}$ is greater than or equal to the predetermined value $\eta1$ (i.e., the number of vehicles considered to have been normally subjected to power transmission). When the ratio R is the ratio of the number NC of vehicles 4 whose power transmission efficiency $\eta_{real}$ is less than the predetermined value $\eta1$ to the number MC of vehicles 4 whose power transmission efficiency $\eta_{real}$ is equal to or greater than the predetermined value $\eta1$, that is, when the ratio R is NC/MC, it can be determined that an abnormality has occurred in the power transmission device 2 installed in a site where the ratio R is equal to or greater than the predetermined abnormality determination value R0.

Further, for example, instead of the number NC of vehicles 4 in which the power transmission efficiency $\eta_{real}$ is less than the predetermined value $\eta1$, the number ND of data in which the power transmission efficiency $\eta_{real}$ is less than the predetermined value $\eta1$ may be compared with a predetermined power transmission abnormality determination value ND0 to determine whether or not an abnormality has occurred in the power transmission device 2. That is, when there is a place where the number ND of the data whose power transmission efficiency $\eta_{real}$ is less than the predetermined value $\eta1$ is equal to or larger than the transmission abnormality determination value ND0, it can be determined that an abnormality has occurred in the power transmission device 2 set at the place.

Figure 6:
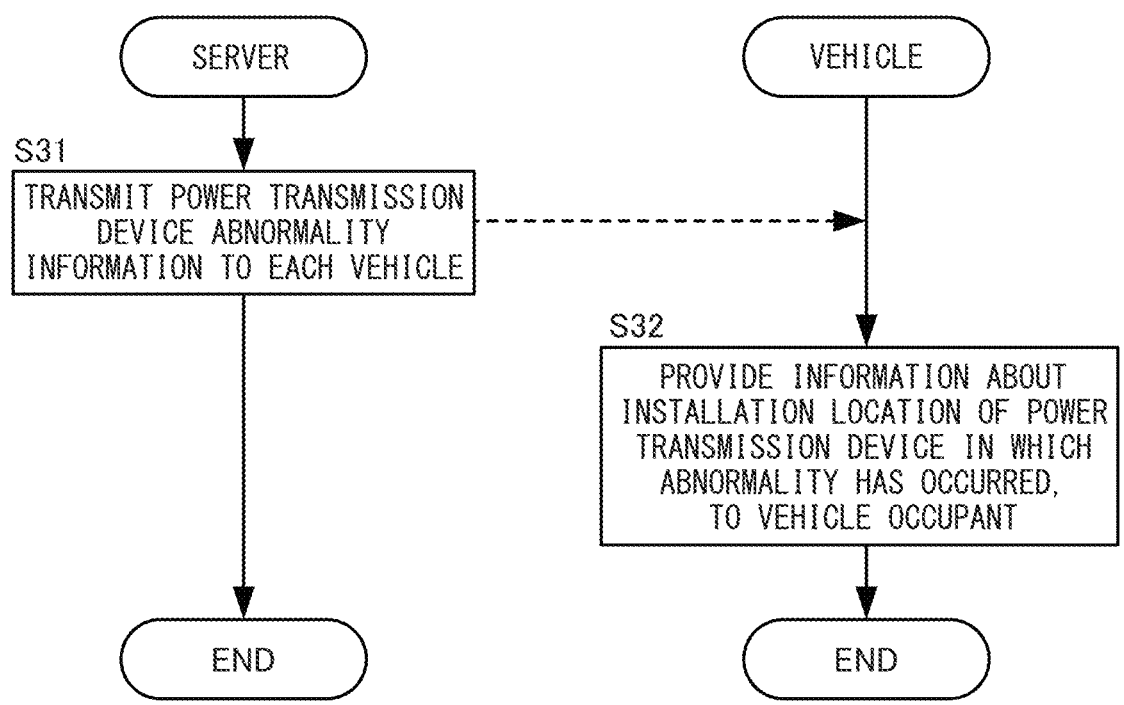
FIG. 6 is a flowchart for explaining details of the processing executed by the server when an abnormality of the power transmission device is detected, and details of the processing executed in each vehicle in association therewith.

FIG. 6 is a flowchart for explaining details of the processing executed by the server 1 when an abnormality of the power transmission device 2 is detected, and details of the processing executed in each vehicle 4 in association with the detected abnormality.

In step S31, the server 1 transmits the power transmission device abnormality information including the information on the installation location of the power transmission device 2 in which the abnormality has occurred, to each vehicle 4.

At this time, for example, if there is a management center that manages each power transmission device 2, the transmission device abnormality information may also be transmitted to the management center in order to arrange for the repair of the power transmission device 2 through the management center. Further, if there is a repair device capable of repairing the power transmission device 2 by acting autonomously, the power transmission device abnormality information may be transmitted to the repair device, and the repair device may be dispatched to the installation site of the power transmission device 2 where the failure has occurred.

In step S32, the vehicle control device 40 of each vehicle 4, when receiving the power transmission device abnormality information from the server 1, provides information about the installation location of the power transmission device 2 in which the abnormality has occurred, via the HMI device 44 to the vehicle occupant. For example, the vehicle control device 40 of each vehicle 4 shows the location of the power transmission device 2 where the abnormality is occurring on the display, if necessary.

At this time, for example, the vehicle 4 which has received the power transmission device abnormality information, if it was an autonomous driving vehicle capable of autonomous travel, based on the power transmission device abnormality information, it may change the scheduled travel route. For example, if the current scheduled traveling route (i.e., the scheduled traveling route before receiving the power transmission device abnormality information) is a traveling route passing through the electrified road including the power transmission device 2 in which an abnormality has occurred, it may be changed to another traveling route that does not pass through the electrified road including the power transmission device 2 in which the abnormality has occurred. As a condition as to whether or not to change the traveling route, only when the abnormal range of the power transmission device 2 on the electrified road is equal to or larger than a predetermined area, the traveling route may be changed to a traveling route that does not pass through the electrified road. This is because, in the electrified road where a large number of power transmission devices 2 is installed, even if an abnormality occurs in a small number of power transmission devices 2, it may be possible to perform sufficient wireless power supply to the vehicle 4 traveling on the electrified road by the other normal power transmission device 2.

According to the present embodiment described above, the server 1 (abnormality determination apparatus) for determining an abnormality of the power transmission device 2 installed on the road includes a server processing unit 13, a server communication unit 11 capable of communicating with a plurality of vehicles 4 (mobile bodies) including a power receiving device 5 for receiving power wirelessly transmitted from the power transmission device 2, and a server storage unit 12 for storing power reception history information received from the vehicle 4. The power reception history information is information including the power receiving location of the received power P2 received by the power receiving device 5 and the power transmission efficiency $\eta_{real}$ calculated based on the received power P2. The server processing unit 13 is configured to extract, from the power reception history information of the plurality of vehicles 4 stored in the server storage unit 12, information on the power receiving location where the power transmission efficiency $\eta_{real}$ is less than the predetermined value $\eta 1$, and to determine an abnormality of the power transmission device 2 based on the extracted information on the power receiving location.

More specifically, the server processing unit 13 is configured to determine that an abnormality has occurred in the power transmission device 2 installed at the power receiving location where the number NC of vehicles 4 whose power transmission efficiency $\eta_{real}$ is less than the predetermined value $\eta 1$ is equal to or greater than the predetermined power transmission abnormality determination value NC0.

Due to this, based on the power reception history information of each vehicle 4 aggregated to the server 1, it is possible to detect the abnormality of the power transmission device 2 and the installation location of the power transmission device 2 where the abnormality is occurring.

For example, the server processing unit 13 may be configured to determine the abnormality of the power transmission device 2 based on the ratio of the vehicles 4 whose power transmission efficiency $\eta_{real}$ is less than the predetermined value $\eta 1$ at the power receiving site where the power transmission efficiency $\eta_{real}$ is less than the predetermined value $\eta 1$. For example, if the ratio is defined as the ratio R obtained by dividing the number NC of vehicles 4 whose power transmission efficiency $\eta_{real}$ is less than the predetermined value $\eta 1$ by the number MC of vehicles 4 whose power transmission efficiency $\eta_{real}$ is equal to or greater than the predetermined value $\eta 1$, it can be determined that an abnormality has occurred in the power transmission device 2 installed at the power receiving location where the ratio R is equal to or greater than the predetermined transmission abnormality determination value R0. Further, for example, the server processing unit 13 may be configured to determine that an abnormality has occurred in the power transmission device 2 installed at a location where the data count ND of the data whose power transmission efficiency $\eta_{real}$ is less than the predetermined value $\eta 1$ is equal to or greater than the predetermined power transmission abnormality determination value ND0. Even if the server processing unit 13 is configured in this manner, the abnormality of the power transmission device 2 and the installation position of the power transmission device 2 in which the abnormality has occurred can be detected on the basis of the power reception history information of each vehicle 4 aggregated in the server 1.

Further, the server processing unit 13 according to the present exemplary embodiment is configured to transmit power transmission device abnormality information including information regarding an installation location of the power transmission device 2 in which an abnormality has occurred to a management center that manages the power transmission device 2 or a repair device that can perform repair of the power transmission device 2 by taking an autonomous action. Thus, it is possible to perform the early repair of the power transmission device 2.

The dynamic wireless power transfer system 100 (abnormality determination system) according to the present embodiment includes a server 1 (abnormality determination apparatus) and a plurality of vehicles 4 (mobile bodies). Then, the server processing unit 13 of the server 1 is configured to transmit the power transmission device abnormality information including information regarding the installation location of the power transmission device 2 in which an abnormality has occurred to the vehicle 4, and the vehicle 4 is configured to set the traveling route in consideration of the received power transmission device abnormality information.

Specifically, the vehicle 4 is configured to change the scheduled traveling route to another electrified road traveling route when the scheduled traveling route before receiving the power transmission device abnormality information was the traveling route passing through the electrified road including the power transmission device 2 in which the abnormality has occurred. Or the vehicle 4, when the scheduled traveling route before receiving the power transmission device abnormality information was the traveling route passing through the electrified road including the power transmission device 2 in which the abnormality has occurred, if the abnormal range of the power transmission device 2 on the electrified road is equal to or larger than a predetermined area, the scheduled traveling route is changed to the traveling route traveling on another electrified road.

Due to this, it is possible to prevent a situation in which it becomes impossible to receive a sufficient power supply from the power transmission device 2 in spite of traveling on the electrified road.

In the present embodiment, the server processing unit 13 of the server 1 is configured to transmit the power transmission device abnormality information including the information on the installation location of the power transmission device 2 in which the abnormality has occurred to the vehicle 4, and the vehicle 4 is configured to provide the information on the installation location of the power transmission device 2 in which the abnormality has occurred to the occupant of the vehicle 4 via the HMI device 44 (information providing device) mounted on the vehicle 4 when the power transmission device abnormality information is received.

Due to this, it is possible to inform the occupant of each vehicle 4 of the installation location of the power transmission device 2 in which the abnormality has occurred.

When the present embodiment is viewed from another point of view, the process executed in the server 1 according to the present embodiment is an abnormality determination method for determining an abnormality of the power transmission device 2 installed on the road, comprising the steps of: collecting power reception history information including a power receiving location of the received power P2 received by the power receiving device 5, and either a power transmission efficiency $\eta_{real}$ calculated based on the received power P2, or the received power P2, by communicating with a plurality of vehicles 4 (mobile bodies) each including a power receiving device 5 for receiving power that is wirelessly transmitted from the power transmission device 2; extracting information of the power receiving location where the power transmission efficiency $\eta_{real}$ is less than a predetermined value $\eta1$ from the collected power reception history information; and determining an abnormality of the power transmission device 2 based on the information of the extracted power receiving location.

Second Embodiment

Next, a second embodiment of the present disclosure will be described. This embodiment differs from the first embodiment in that abnormalities of the foreign object detection device 24 and the living object protection device 25 are detected. Hereinafter, the difference will be mainly described.

Figure 7:
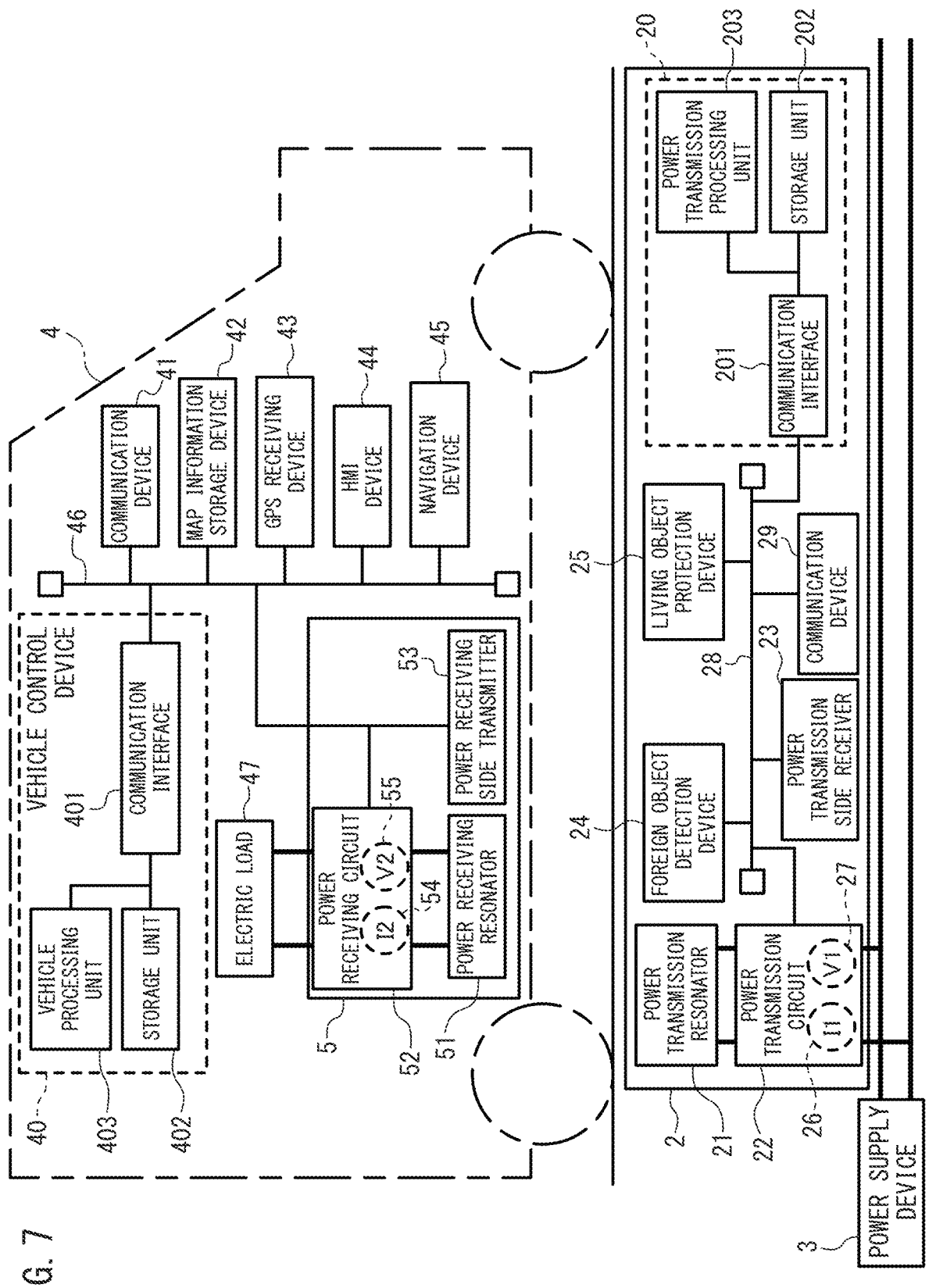
FIG. 7 is a view showing a detailed configuration of a power transmission device and a vehicle according to the second embodiment of the present disclosure.

FIG. 7 is a diagram illustrating a detailed configuration of the power transmission device 2 and the vehicle 4 according to the present embodiment.

As shown in FIG. 7, the configuration of the power transmission device 2 and the vehicle 4 according to the present embodiment is the same as the first embodiment, except that the power transmission device 2 includes a communication device 29. The communication device 29 is a terminal having a wireless communication function and is connected to the network 6 via the wireless base station 7 by accessing the wireless base station 7 (see FIG. 1) connected to the network 6 (see FIG. 1) via a gateway (not shown). As a result, in the present embodiment, communication is also performed between each power transmission device 2 and the server 1.

Figure 8:
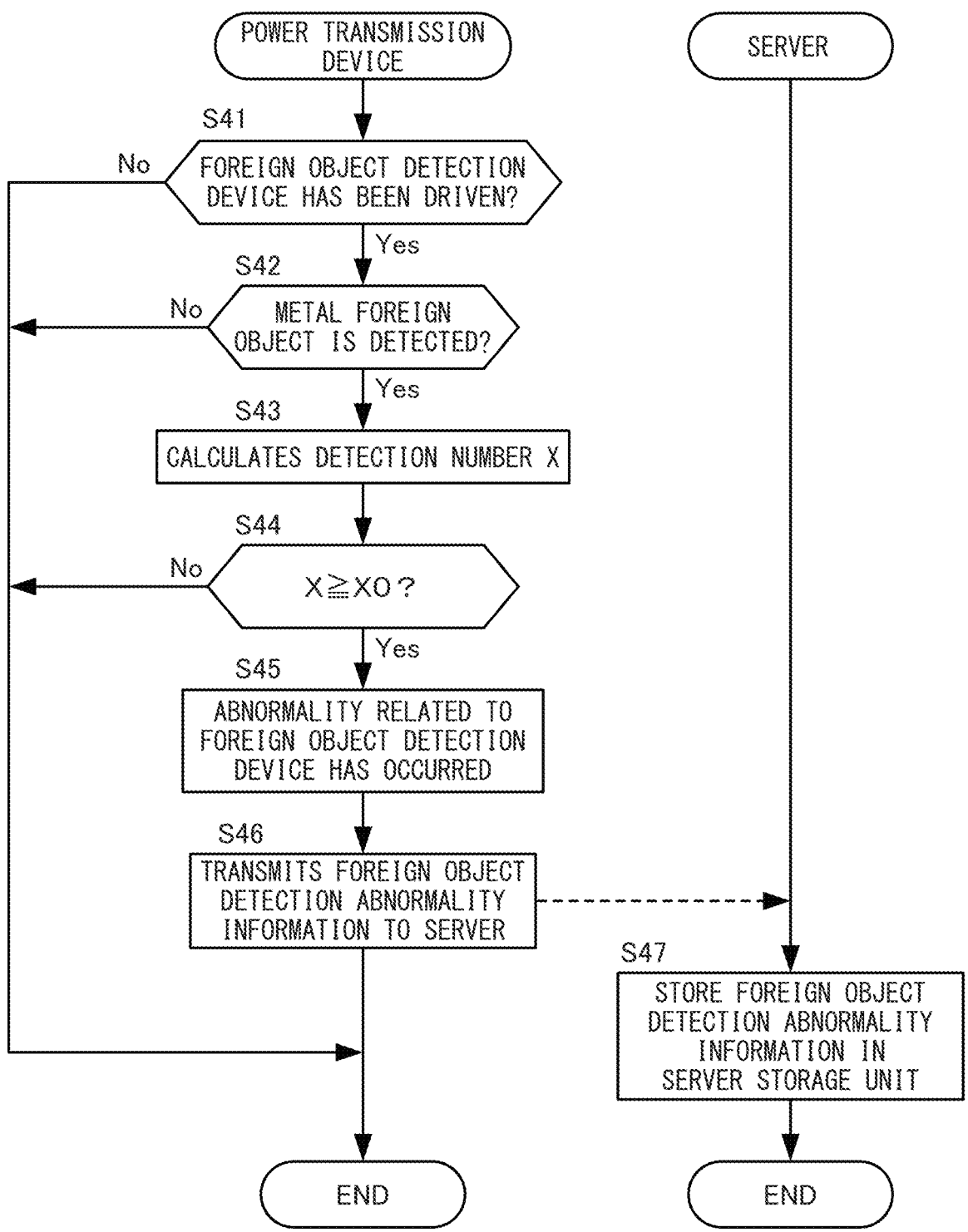
FIG. 8 is a flowchart for explaining details of the processing of the present disclosure executed in each power transmission device for detecting the abnormality of the foreign object detection device, and details of the processing executed in the server along with the contents.

FIG. 8 is a flowchart for explaining details of the processing executed in each power transmission device 2 and the contents of the processing executed in the server 1 along with details of the processing in order to detect the abnormality of the foreign object detection device 24.

In step S41, the power transmission control device 20 of the power transmission device 2 determines whether or not the foreign object detection device 24 has been driven with the reception of the approach signal. If the power transmission control device 20 has driven the foreign object detection device 24, the process proceeds to step S42. On the other hand, if the power transmission control device 20 has not driven the foreign object detection device 24, the power transmission control device 20 ends the present process.

In step S42, the power transmission control device 20 of the power transmission device 2 detects whether the metal foreign object is detected by the foreign object detection device 24. When a metal foreign object is detected, the power transmission control device 20 proceeds to the process of step S43. On the other hand, the power transmission control device 20, when the metal foreign object is not detected, terminates the present process.

In step S43, the power transmission control device 20 of the power transmission device 2 stores the detection time of the metal foreign object in the storage unit 202. The power transmission control device 20 also refers to the detection time of the metal foreign object so far stored in the storage unit 202, and calculates the detection count X of the metal foreign object from the present to some point in the past.

In step S44, the power transmission control device 20 of the power transmission device 2 determines whether the detection count X of the metal foreign object is equal to or greater than a predetermined abnormality determination threshold X0. If the detection count X of the metal foreign object is equal to or greater than the abnormality determination threshold value X0, the power transmission control device 20 proceeds to the process of step S45. On the other hand, if the detection count X of the metal foreign object is less than the abnormality determination threshold value X0, the power transmission control device 20 ends the current processing.

In step S45, the power transmission control device 20 of the power transmission device 2 determines that an abnormality related to the foreign object detection device 24 has occurred. Specifically, the power transmission control device 20 determines that at least one of the following abnormalities has occurred: the abnormality in the foreign object detection device 24 itself, or the abnormality in which there is an immovable foreign object at the installation location of the power transmission device 2. Incidentally, the power transmission control device 20, when it is determined that an abnormality related to the foreign object detection device 24 has occurred, until the abnormality is solved, stops the power transmission to the power receiving device 5.

In step S46, the power transmission control device 20 of the power transmission device 2 transmits information (hereinafter referred to as "foreign object detection abnormality information") including the installation location of the power transmission device 2 and a notification indicating that an abnormality has occurred with respect to the foreign object detection device 24 installed in the installation location to the server 1.

In step S47, the server 1 stores the foreign object detection abnormality information received from each power transmission device 2 in the server storage unit 12. As a result, the server 1 can grasp the installation location of the power transmission device 2 in which an abnormality has occurred with respect to the foreign object detection device 24. Therefore, it is possible to transmit information on the installation location of the power transmission device 2 in which an abnormality has occurred with respect to the foreign object detection device 24 to each vehicle 4 via the server 1, and to arrange for repair of the foreign object detection device 24 or removal of the immovable foreign object.

Figure 9:
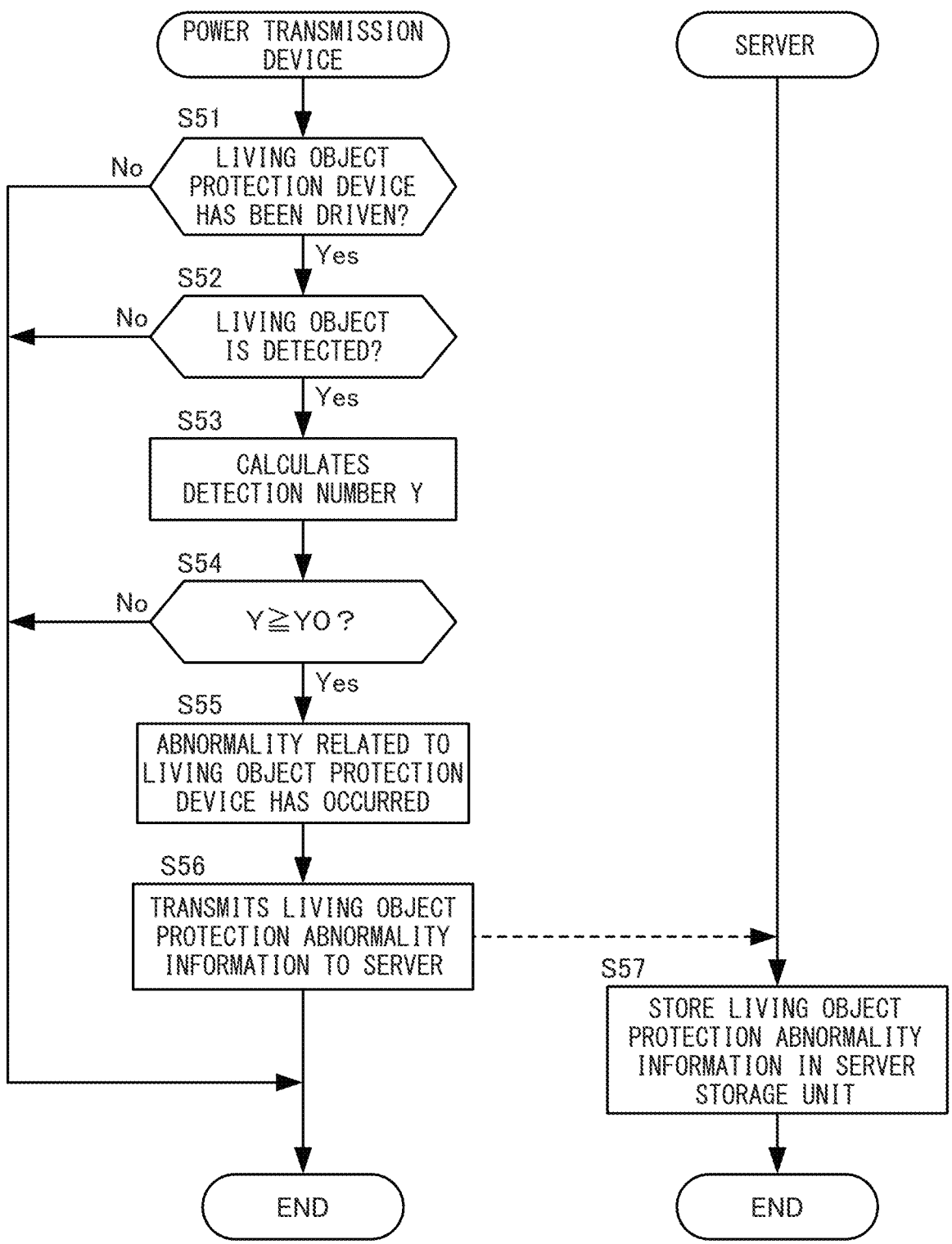
FIG. 9 is a flowchart for explaining details of processing executed in each power transmission device for detecting an abnormality of the biological protection apparatus, and details of processing executed in the server in association with the processing.

FIG. 9 is a flowchart for explaining details of the processing executed in each power transmission device 2 and the contents of the processing executed in the server 1 along with details of the processing in order to detect the abnormality of the living object protection device 25.

In step S51, the power transmission control device 20 of the power transmission device 2 determines whether or not the living object protection device 25 has been driven with the reception of the approach signal. If the power transmission control device 20 has driven the living object protection device 25, the process proceeds to step S52. On the other hand, if the living object protection device 25 has not been driven, the power transmission control device 20 ends the current processing.

In step S52, the power transmission control device 20 of the power transmission device 2 detects whether or not a living object has been detected by the living object protection device 25. When the living object is detected, the power transmission control device 20 proceeds to the process of step S53. On the other hand, when the living object is not detected, the power transmission control device 20 ends the current processing.

In step S53, the power transmission control device 20 of the power transmission device 2 stores the detection time of the living object in the storage unit 202. The power transmission control device 20 also refers to the detection time of the living object so far stored in the storage unit 202, and calculates the detection number Y of the living object from the present to some point in the past.

In step S54, the power transmission control device 20 of the power transmission device 2 determines whether or not the detection number Y of the living object is equal to or greater than a predetermined abnormality determination threshold Y0. If the detection number Y of the living object is equal to or greater than the abnormality determination threshold Y0, the power transmission control device 20 proceeds to the process of step S55. On the other hand, if the detection number Y of the living object is less than the abnormality determination threshold Y0, the power transmission control device 20 ends the current processing.

In step S55, the power transmission control device 20 of the power transmission device 2 determines that an abnormality related to the living object protection device 25 has occurred. Specifically, the power transmission control device 20 determines that at least one of the following abnormalities has occurred: the abnormality of the living object protection device 25 itself, or the abnormality in which there is an immovable living object exists at the installation location of the power transmission device 2. Incidentally, the power transmission control device 20, when it is determined that an abnormality related to the living object protection device 25 has occurred, until the abnormality is solved, stops the power transmission to the power receiving device 5.

In step S56, the power transmission control device 20 of the power transmission device 2 transmits information (hereinafter referred to as "living object protection abnormality information") including the installation location of the power transmission device 2 and a notification indicating that an abnormality has occurred with respect to the living object protection device 25 installed in the installation location to the server 1.

In step S57, the server 1 stores the biometric protection abnormality information received from each power transmission device 2 in the server storage unit 12. Thereby, the server 1 can grasp the installation location of the power transmission device 2 in which the abnormality related to the living object protection device 25 has occurred. Therefore, it is possible to transmit information on the installation location of the power transmission device 2 in which the abnormality related to the living object protection device 25 has occurred to each vehicle 4 via the server 1, and to arrange for repair of the living object protection device 25 or removal of the immovable living object.

Figure 10:
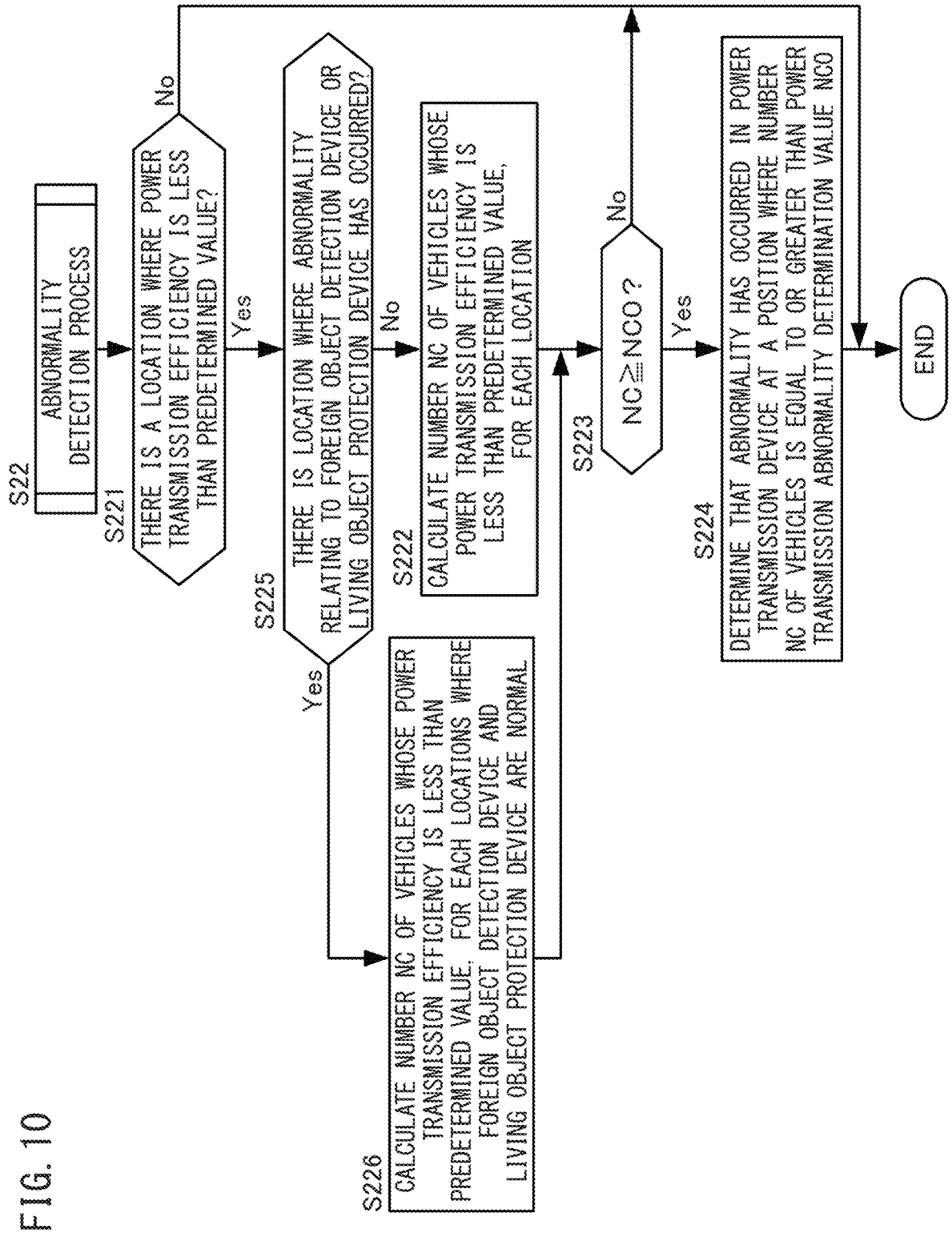
FIG. 10 is a flowchart for explaining details of the abnormality detection process according to the second embodiment of the present disclosure.

FIG. 10 is a flowchart illustrating a detail of an abnormality detection process according to the present embodiment executed by the server 1. In FIG. 10, since the content of the process of the steps S221~S224 is the same as that of the first embodiment, the explanation thereof is omitted here.

In step S225, the server 1 determines whether or not an abnormality relating to the foreign object detection device 24 or an abnormality relating to the living object protection device 25 has occurred in a place where the power transmission efficiency $\eta_{real}$ is less than a predetermined value $\eta 1$.

The server 1 proceeds to the process of step S226, when there is a place where the abnormality relating to the foreign object detection device 24 or the abnormality relating to the living object protection device 25 have occurred among the places where the power transfer efficiency $\eta_{real}$ is less than the predetermined value $\eta 1$. On the other hand, the server 1 proceeds to the process of step S222, when neither the abnormality relating to the foreign object detection device 24 nor the abnormality relating to the living object protection device 25 has occurred among the places where the power transmission efficiency $\eta_{real}$ is less than the predetermined value $\eta 1$.

In step S226, the server 1 refers to the aggregated power reception history information, the foreign object detection abnormality information and the living object protection abnormality information, extracts a location where neither an abnormality related to the foreign object detection device 24 nor an abnormality related to the living object protection device 25 has occurred from the locations where the power transmission efficiency $\eta_{real}$ is less than the predetermined value $\eta 1$, and calculates the number NC of vehicles 4 whose power transmission efficiency $\eta_{real}$ is less than the predetermined value $\eta 1$ for each of the extracted locations.

As described above, in the present embodiment, the number NC of vehicles 4 whose power transmission efficiency $\eta_{real}$ is less than the predetermined value $\eta 1$ is calculated, after excluding the locations where the abnormality related to the foreign object detection device 24 or the living object protection device 25 has occurred from the locations where the power transmission efficiency $\eta_{real}$ is less than the predetermined value $\eta 1$. Due to this, it is possible to specify a place where the power transmission efficiency $\eta_{real}$ is less than the predetermined value $\eta 1$ even though the foreign object detection device 24 and the biological protection apparatus 25 are normal. In other words, it is possible to specify a place where the power transmission device 2 in which an abnormality has occurred in the power transmission is installed even though the foreign object detection device 24 and the biological protection apparatus 25 are normal.

The dynamic wireless power transfer system 100 (abnormality determination system) according to the present embodiment described above includes the server 1 (abnormality determination apparatus) and the power transmission device 2. The power transmission device 2 includes a detection device (foreign object detection device 24 or living object protection device 25) configured to detect a foreign object present on a road, and a power transmission control device 20 configured to determine that an abnormality related to the detection device has occurred when the number of times (X or Y) of detection of the foreign object within a predetermined period of time reaches or exceeds a predetermined number of times (X0 or Y0). Thus, it is possible to detect that an abnormality has occurred in the foreign object detection device 24 or the living object protection device 25

Further, the power transmission device 2 includes a communication device 29 capable of communicating with the server 1, and the power transmission control device 20 is configured to transmit, when the detection number of the foreign object within a predetermined period of time exceeds a predetermined number, information on the installation location of the power transmission device 2 in which an abnormality related to the detection device has occurred, to the abnormality determination apparatus via the communication device 29.

Due to this, the server 1 can grasp the installation location of the power transmission device 2 in which an abnormality has occurred with respect to the detection device. Therefore, it is possible to transmit, via the server 1, information on the installation location of the power transmission device 2 in which an abnormality related to the detection device has occurred, to each vehicle 4, and to arrange for repair of the detection device and removal of the immovable object.

Further, in the present embodiment, the server storage unit 12 stores information regarding the installation location of the power transmission device 2 in which an abnormality related to the detection device (the foreign object detection device 24 or the living object protection device 25) has occurred received from the power transmission control device 20 of the power transmission device 2. The server processing unit 13 is configured to identify the installation location of the power transmission device 2 in which an abnormality has occurred from among the installation locations of the power transmission device 2 in which an abnormality related to the detection device has not occurred based on the power reception history information and the information received from the power transmission device 20.

Due to this, it is possible to distinguish whether an abnormality has occurred in the detection device or in the power transmission device 20, and to identify the installation location of the power transmission device 2 in which the abnormality has occurred in the power transmission device 20.

Above, embodiments of the present disclosure were explained, but the embodiments only show some of the examples of application of the present disclosure and are not mean to limit the technical scope of the present disclosure to the specific configurations of the embodiments.

For example, in the first embodiment described above, information in which the power transmission efficiency $\eta_{real}$ calculated based on the received power P2 and the location information of the location where the power transmission efficiency $\eta_{real}$ is obtained are associated with each other is transmitted from the respective vehicles 4 to the servers 1 as the received power history information. However, it is also possible to transmit information in which the received power P2 and the location information of the location where the received power P2 is obtained are associated with each other, as the received power history information from the respective vehicles 4 to the server 1, and to convert the received power into the electric power transmission efficiency $\eta_{real}$ in the server 1. In other words, in the first embodiment, the power receiving history information may be information including the received power P2 received by the power receiving device 5 and the power receiving location.

The invention claimed is:

1. An abnormality determination apparatus for determining an abnormality of a power transmission device installed on a road, the abnormality determination apparatus comprising:
    a processing unit;
    a communication unit configured to communicate with a plurality of mobile bodies each comprising a power receiving device for receiving power wirelessly transmitted from the power transmission device; and
    a storage unit configured to store power reception history information received from each of the plurality of mobile bodies, wherein the power reception history information includes
        a power receiving location of the received power received by the power receiving device, and
        either a power transmission efficiency calculated based on the received power, or the received power,
    wherein
    the processing unit is configured to, in response to an amount of aggregated power reception history information, in which the power reception history information of each of the plurality of mobile bodies is aggregated, being equal to or larger than a predetermined amount,
        extract information of the power receiving location where the power transmission efficiency is less than a predetermined value from the power reception history information of the plurality of mobile bodies stored in the storage unit,
        determine the abnormality of the power transmission device based on the extracted information of the power receiving location, and
    in response to a determination that the abnormality of the power transmission device has occurred in the power transmission device installed at the power receiving location, transmit power transmission device abnormality information including information on an installation location of the power transmission device in which the abnormality has occurred to instruct a repair apparatus to autonomously act to repair the power transmission device.

2. The abnormality determination apparatus according to claim 1, wherein
    the processing unit is configured to determine that the abnormality has occurred in the power transmission device installed at the power receiving location in response to a number of mobile bodies, whose power transmission efficiency is less than the predetermined value, being equal to or greater than a predetermined power transmission abnormality determination value.

3. The abnormality determination apparatus according to claim 1, wherein
the processing unit is configured to determine the abnormality of the power transmission device based on a ratio of mobile bodies having the power transmission efficiency equal to or greater than the predetermined value at the power receiving location where the power transmission efficiency is less than the predetermined value.

4. The abnormality determination apparatus according to claim 3, wherein
the ratio is a ratio of a number of the mobile bodies in which the power transmission efficiency is less than the predetermined value divided by a number of the mobile bodies in which the power transmission efficiency is equal to or greater than the predetermined value, and
the processing unit is configured to determine that the abnormality has occurred in the power transmission device installed at the power receiving location in response to the ratio being equal to or greater than a predetermined power transmission abnormality determination value.

5. The abnormality determination apparatus according to claim 1, wherein
the processing unit is configured to determine that the abnormality has occurred in the power transmission device installed at a location where a number of data for which the power transmission efficiency is less than the predetermined value is equal to or greater than a predetermined power transmission abnormality determination value.

6. The abnormality determination apparatus according to claim 1, wherein
the processing unit is configured to transmit the power transmission device abnormality information including the information on the installation location of the power transmission device in which the abnormality has occurred to a management center managing the power transmission device.

7. An abnormality determination system, comprising the abnormality determination apparatus according to claim 1, and the power transmission device, wherein
the power transmission device comprises:
a detection device configured to detect a foreign object present on the road; and
a power transmission control device configured to determine that an abnormality related to the detection device has occurred in response to a number of times of detection of the foreign object within a predetermined period of time being equal to or greater than a predetermined number of times.

8. The abnormality determination system according to claim 7, wherein
the power transmission device further comprises a communication device configured to communicate with the abnormality determination apparatus, and
the power transmission control device is configured to transmit, in response to the number of times of detection of the foreign object within the predetermined period of time being equal to or greater than the predetermined number of times, information on the installation location of the power transmission device in which the abnormality related to the detection device has occurred, to the abnormality determination apparatus via the communication device.

9. The abnormality determination system according to claim 8, wherein the storage unit stores the information on the installation location of the power transmission device in which the abnormality related to the detection device has occurred received from the power transmission device, and
the processing unit is configured to identify the installation location of the power transmission device in which an abnormality has occurred from among installation locations of the power transmission device in which an abnormality related to the detection device has not occurred based on the power reception history information and information received from the power transmission device.

10. The abnormality determination system according to claim 7, wherein
the detection device is a foreign object detection device for detecting a metal foreign object present on the road or a biological protection device for detecting a living body present on the road.

11. An abnormality determination system, comprising an abnormality determination apparatus as claimed in claim 1, and the plurality of mobile bodies, wherein
the processing unit of the abnormality determination apparatus is configured to transmit to a mobile body of the plurality of mobile bodies the power transmission device abnormality information including the information on the installation location of the power transmission device where the abnormally has occurred, and
the mobile body is configured to set a travel route in consideration of the received power transmission device abnormality information.

12. The abnormality determination system of claim 11, wherein
the mobile body is configured to change the set travel route to a travel route that does not pass through the road when the set travel route before receiving the power transmission device abnormality information is a travel route that passes through the road including the power transmission device in which the abnormality has occurred.

13. The abnormality determination system according to claim 11, wherein
the mobile body is configured to change the set travel route to a travel route that does not pass through the road when the set travel route before receiving the power transmission device abnormality information is a travel route that passes through the road including the power transmission device in which the abnormality has occurred, in response to an abnormality range of the power transmission device on the road being equal to or larger than a predetermined area.

14. An abnormality determination system comprising an abnormality determination apparatus as claimed in claim 1, and the plurality of mobile bodies, wherein
the processing unit of the abnormality determination apparatus is configured to transmit the power transmission device abnormality information including the information on the installation location of the power transmission device in which the abnormality has occurred to a mobile body of the plurality of mobile bodies, and
the mobile body is configured to provide the information on the installation location of the power transmission device in which the abnormality has occurred to an occupant of the mobile body via an information providing apparatus mounted on the mobile body in response to the power transmission device abnormality information being received.

15. An abnormality determination method of determining an abnormality of a power transmission device installed on a road, the abnormality determination method comprising:

collecting power reception history information including
a power receiving location of received power received by a power receiving device, and
either a power transmission efficiency calculated based on the received power, or the received power, by communicating with a plurality of mobile bodies each including the power receiving device for receiving power wirelessly transmitted from the power transmission device; and in response to an amount of aggregated power reception history information in which the power reception history information of each of the plurality of mobile bodies is aggregated being equal to or larger than a predetermined amount, extracting information of the power receiving location where the power transmission efficiency is less than a predetermined value from the collected power reception history information;

determining the abnormality of the power transmission device based on the extracted information of the power receiving location; and in response to a determination that the abnormality of the power transmission device has occurred in the power transmission device installed at the power receiving location, transmitting power transmission device abnormality information including information on an installation location of the power transmission device in which the abnormality has occurred to instruct a repair apparatus to autonomously act to repair the power transmission device.

* * * * *